(12) United States Patent
Wang

(10) Patent No.: US 8,717,207 B2
(45) Date of Patent: May 6, 2014

(54) SYSTEM AND METHOD FOR PROCESSING SIGNAL

(75) Inventor: Kang-Bin Wang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/589,293

(22) Filed: Aug. 20, 2012

(65) Prior Publication Data

US 2013/0162317 A1 Jun. 27, 2013

(30) Foreign Application Priority Data

Dec. 24, 2011 (CN) .......................... 2011 1 0438364

(51) Int. Cl.
*H03M 1/00* (2006.01)

(52) U.S. Cl.
USPC .......................................... 341/110; 327/306

(58) Field of Classification Search
USPC .................................. 341/110, 155; 327/306
See application file for complete search history.

(56) References Cited

U.S. PATENT DOCUMENTS

| | | | | |
|---|---|---|---|---|
| 5,815,100 A | * | 9/1998 | Rush et al. | 341/110 |
| 7,602,320 B2 | * | 10/2009 | Klein et al. | 341/110 |
| 2010/0225303 A1 | * | 9/2010 | Min et al. | 324/76.24 |

* cited by examiner

*Primary Examiner* — Jean B Jeanglaude
(74) *Attorney, Agent, or Firm* — Novak Druce Connolly Bove + Quigg LLP

(57) ABSTRACT

A system for processing signals includes an original wave outputting module, a signal sampling module and a signal processing module. The signal processing module includes an SCM, an FGPA chip and an amplifier electrically connected to the SCM. The original wave outputting module outputs an originating wave. The signal sampling module samples the wave, and outputs a plurality of signals. The signal processing module receives the plurality of signals, and outputs an amplified wave. The SCM has a predetermined wave frequency value and a predetermined wave amplitude value. The FGPA chip generates digital signals according to the predetermined wave frequency value. The amplifier amplifies the digital signals according to the predetermined wave amplitude value.

10 Claims, 4 Drawing Sheets

SYSTEM AND METHOD FOR PROCESSING SIGNAL

BACKGROUND

1. Technical Field

The present disclosure relates to a system and method for processing signals.

2. Description of Related Art

Clock signals and driving signals of different frequencies and different amplitudes are used in debugging electronic devices. A signal generator may be used to generate the clock signals and driving signals. However, such a signal generator can generate special waves, such as square waves and sine waves. The typical signal generator can not generate random waves, such as irregular shape waves. Therefore, such a signal generator can not meet the requirements of debugging.

Therefore there is a need for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one".

Figure 1:
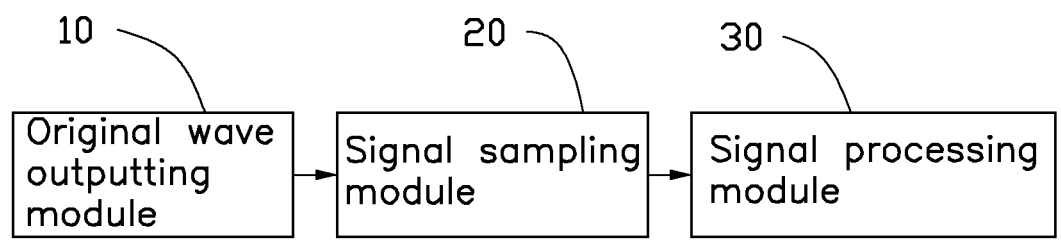
FIG. 1 is a block diagram of an embodiment of a system for processing signals, the system comprising an original wave outputting module, a signal sampling module, and a signal processing module.

FIG. 1 illustrates a system for processing signals in accordance with an embodiment. The system includes an original wave outputting module 10, a signal sampling module 20 electrically connected to the original wave outputting module 10 and a signal processing module 30 electrically connected to the signal sampling module 20. The original wave outputting module 10 is adapted to output a wave. The wave can be regular shape wave or irregular shape wave, such as square wave, sine wave or mixed wave. In one embodiment, the original wave outputting module 10 is a computer including a wave editing interface. The wave editing interface is adapted to input a random wave in the original wave outputting module 10. The signal sampling module 20 is adapted to sample the wave from the original wave outputting module 10, and output a plurality of signals to the signal processing module 30 after the sampling.

Figure 2:
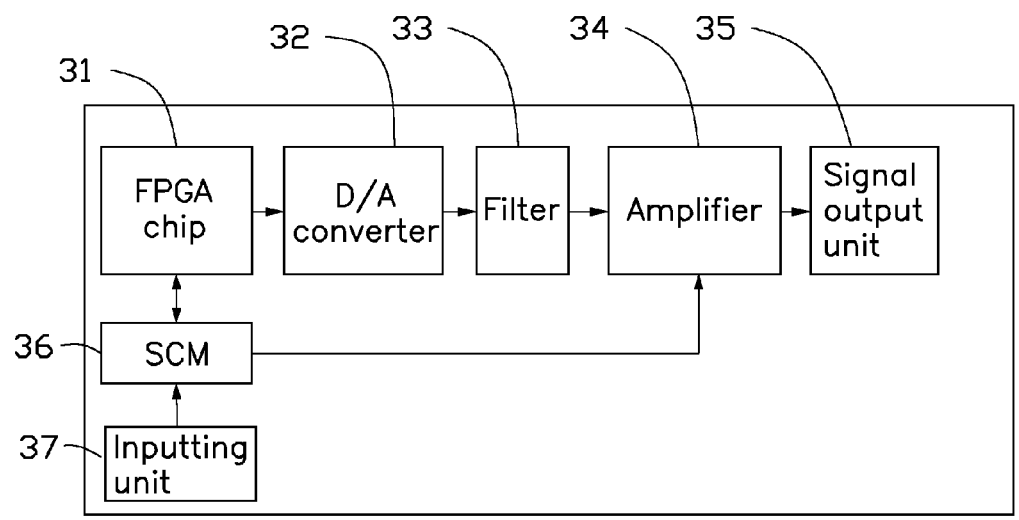
FIG. 2 is a block diagram of the signal processing module of FIG. 1, the signal processing module comprising a Field-Programmable Gate Array (FPGA).

FIG. 2 illustrates the signal processing module 30 in accordance with one embodiment. The signal processing module 30 includes a FPGA chip 31, a Digital to Analog (D/A) converter 32 electrically connected to the FPGA chip 31, a filter 33 electrically connected to the D/A converter 32, an amplifier 34 electrically connected to the filter 33, a signal output unit 35 electrically connected to the amplifier 34, a single-chip microcomputer (SCM) 36 electrically connected to the FPGA chip 31 and the amplifier 34, and an inputting unit 37 electrically connected to the SCM 36. The inputting unit 37 is adapted to input a predetermined wave frequency value and a predetermined wave amplitude value in the SCM 36. The SCM 36 is adapted to adjust frequencies of signals outputted from the FPGA chip 31 according to the predetermined wave frequency value. The SCM 36 is adapted to adjust the amplitude of the amplifier 34 according to the predetermined wave amplitude value. In one embodiment, the inputting unit 37 includes a plurality of numeral buttons, selecting buttons, and sign buttons.

Figure 3:
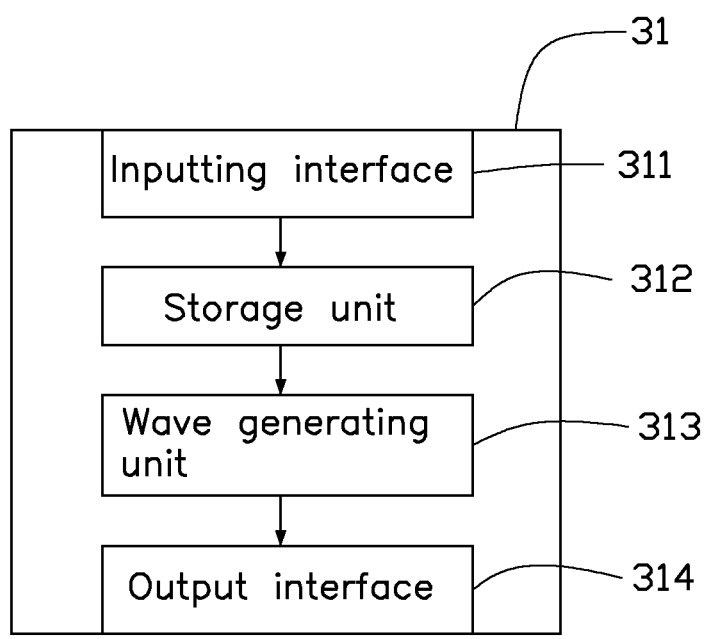
FIG. 3 is a block diagram of the FGPA of FIG. 2.

FIG. 3 illustrates the FPGA chip 31 in accordance with one embodiment. The FPGA chip 31 includes an inputting interface 311, a storage unit 312 electrically connected to the inputting interface 311, a wave generating unit 313 electrically connected to the storage unit 312, and an output interface 314 electrically connected to the wave generating unit 313. The inputting interface 311 is adapted to receive the plurality of signals from the signal sampling module 20. The storage unit 312 is adapted to store the plurality of signals to a plurality of storage addresses. The wave generating unit 313 is adapted to read the plurality of stored signals from the storage unit 312 according to the plurality of addresses. The wave generating unit 313 is adapted to generate a wave of digital signals according to an amplitude sequence of the plurality of stored signals and the predetermined frequency value. The output interface 314 is adapted to transmit digital signals to the D/A converter 32. The D/A converter 32 is adapted to convert the digital signals to wave or analog signals. The filter 33 is adapted to filter the analog signals, and output filtered analog signals to the amplifier 34. The amplifier 34 is adapted to amplify the filtered analog signals according to the predetermined amplitude value. The amplifier 34 is adapted to output amplified analog signals. The signal output unit 35 is adapted to transmit the amplified analog signals to an electronic device (not shown). In one embodiment, the inputting interface 311 is a Universal Asynchronous Receiver/Transmitter (UART) interface.

Figure 4:
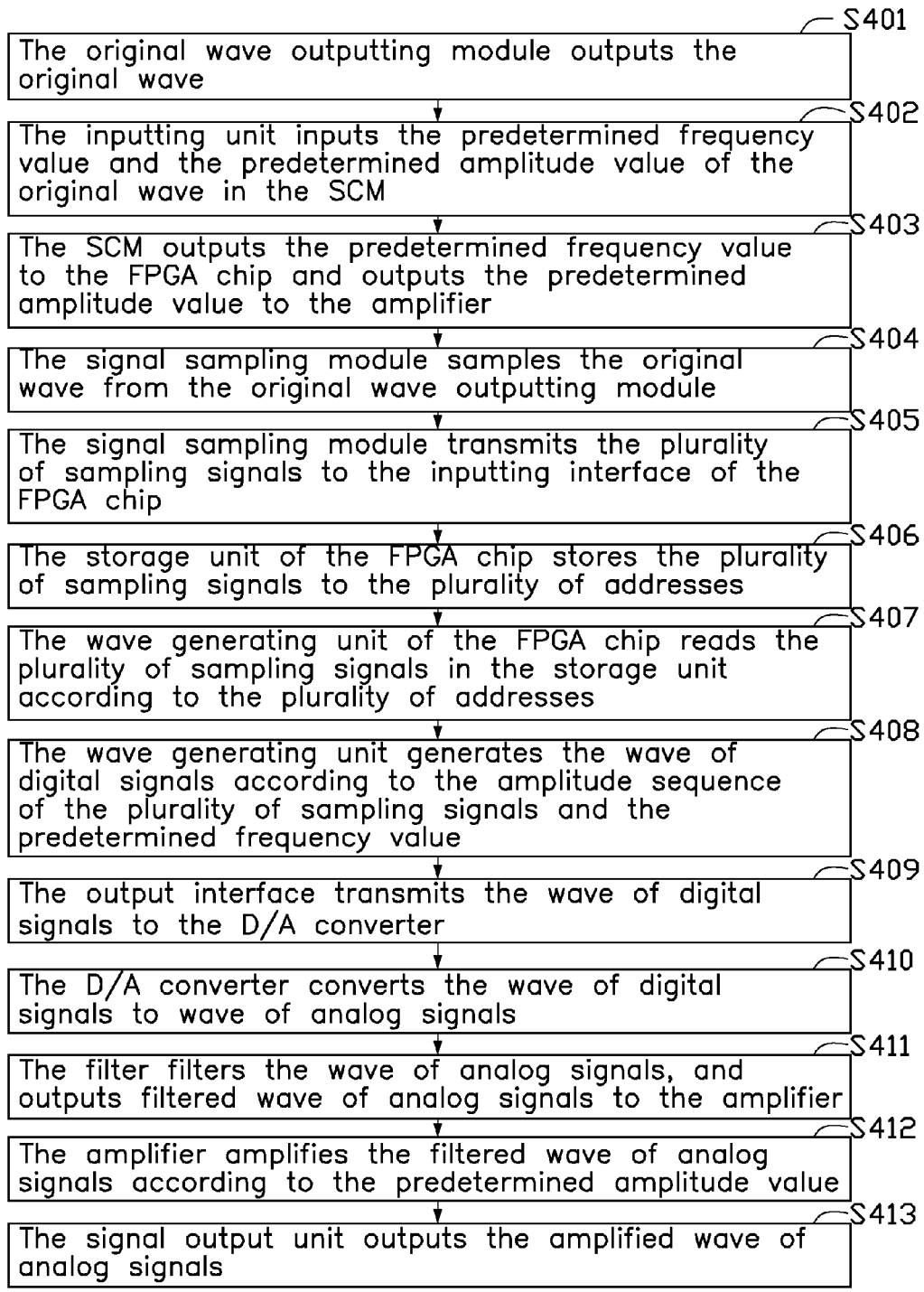
FIG. 4 is a flow chart of an embodiment of a method for processing signals.

FIG. 4 illustrates a flow chart of a method for processing signals in accordance with one embodiment. Depending on the embodiment, certain steps may be removed, while others may be added, and the sequence of the steps may be altered. In one embodiment, the method for processing signals includes the following steps:

S401: the original wave outputting module 10 outputs a wave;

S402: the inputting unit 37 inputs a predetermined wave frequency value and a predetermined wave amplitude value of the original wave in the SCM 36;

S403: the SCM 36 outputs the predetermined wave frequency value to the FPGA chip 31 and outputs the predetermined wave amplitude value to the amplifier 34;

S404: the signal sampling module 20 samples the wave from the original wave outputting module 10; in one embodiment, the signal sampling module 20 samples 1024 points within a certain time period according to a fixed frequency; each of the 1024 points includes an amplitude value; the signal sampling module 20 records the sequence of amplitudes of the 1024 points;

S405: the signal sampling module 20 outputs the plurality of signals to the inputting interface 311 of the FPGA chip 31;

S406: the storage unit 312 of the FPGA chip 31 stores the plurality of signals to a plurality of storage addresses; in one embodiment, the signal of the first point of the 1024 is stored in address 1; the signal of the second point of the 1024 is stored in address 2; and the signal of the nth point in the 1024 is stored in address n;

S407: the wave generating unit 313 of the FPGA chip 31 reads the plurality of sequentially stored signals in the storage unit 312 according to the plurality of addresses;

S408: the wave generating unit 313 generates digital signals according to the amplitude sequence of the plurality of stored signals and the predetermined frequency required;

S409: the output interface 314 transmits the digital signals to the D/A converter 32;

S410: the D/A converter 32 converts the digital signals to analog signals;

S411: the filter 33 filters the analog signals, and outputs filtered analog signals to the amplifier 34;

S412: the amplifier 34 amplifies the filtered analog signals according to the predetermined amplitude value required; and S413: the signal output unit 35 outputs the amplified analog signals.

Even though numerous characteristics and advantages of the present disclosure have been set forth in the foregoing description, together with details of the structure and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

Depending on the embodiment, certain steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A system for processing signals, the system comprising:
    an original wave outputting module outputting an original wave;
    a signal sampling module sampling the original wave from the original wave outputting module and outputting a plurality of sampling signals; and
    a signal processing module receiving the plurality of sampling signals and outputting an amplified wave, the signal processing module comprising:
    a single-chip microcomputer (SCM) having a predetermined frequency value and a predetermined amplitude value;
    a Field-Programmable Gate Array (FGPA) chip electrically connected to the SCM, the FPGA chip generating a wave of digital signals according to the predetermined frequency value; and
    an amplifier electrically connected to the SCM, the amplifier amplifying the wave of digital signals according to the predetermined amplitude value.

2. The system of claim 1, wherein the signal processing module further comprises a Digital to Analog (D/A) converter electrically connected to the FPGA chip; the D/A converter receives the wave of digital signals, and converts the wave of digital signals to a wave of analog signals.

3. The system of claim 2, wherein the signal processing module further comprises a filter electrically connected to the D/A converter and the amplifier; the filter filters the wave of analog signals, and outputs a filtered wave of analog signals to the amplifier.

4. The system of claim 3, wherein the FPGA chip comprises an inputting interface, a storage unit electrically connected to the inputting interface, a wave generating unit electrically connected to the storage unit, and an output interface electrically connected to the wave generating unit; the inputting interface receives the plurality of sampling signals from the signal sampling module; the storage unit stores the plurality of sampling signals to a plurality of addresses; and the wave generating unit generates the wave of digital signals according to an amplitude sequence of the plurality of sampling signals and the predetermined frequency value.

5. The system of claim 4, wherein the inputting interface is a Universal Asynchronous Receiver/Transmitter (UART) interface.

6. The system of claim 1, wherein the signal processing module further comprises an inputting unit electrically connected to the SCM; the inputting unit inputs the predetermined frequency value and the predetermined amplitude value in the SCM; the inputting unit comprises a plurality of numeral buttons, selecting buttons, and sign buttons.

7. A method for processing signals, the method comprising:
    outputting a regular shape or irregular shape original wave by an original wave outputting module;
    predetermining a predetermined frequency value and a predetermined amplitude value in a SCM;
    transmitting the predetermined frequency value to a FPGA chip and transmitting the predetermined amplitude value to an amplifier by the SCM;
    sampling the original wave from the original wave outputting module by a signal sampling module;
    outputting a plurality of sampling signals to the FPGA chip by the signal sampling module; and
    generating a wave of digital signals according to the predetermined frequency value and the predetermined amplitude value by the FPGA chip.

8. The method of claim 7, wherein generating the wave of digital signals comprises storing the plurality of sampling signals to a plurality of addresses by a storage unit in the FPGA chip; reading the plurality of sampling signals in the storage unit according to the plurality of addresses by a wave generating unit in the FPGA chip; and generating the wave of digital signals according to an amplitude sequence of the plurality of sampling signals and the predetermined frequency value by the wave generating unit.

9. The method of claim 8, wherein the step of generating the wave of digital signals further comprises converting the wave of digital signals to a wave of analog signals by a D/A converter, and filtering the wave of analog signals by a filter.

10. The method of claim 9, wherein the step of generating the wave of digital signals further comprises amplifying the filtered wave of analog signals according to the predetermined amplitude value by an amplifier, and outputting an amplified wave of analog signals by the amplifier.

* * * * *